United States Patent
Dominique et al.

(10) Patent No.: US 7,565,594 B2
(45) Date of Patent: Jul. 21, 2009

(54) METHOD AND APPARATUS FOR DETECTING A PACKET ERROR IN A WIRELESS COMMUNICATIONS SYSTEM WITH MINIMUM OVERHEAD USING EMBEDDED ERROR DETECTION CAPABILITY OF TURBO CODE

(75) Inventors: Francis Dominique, Rockaway, NJ (US); Hongwei Kong, Denville, NJ (US); Walid E Nabhane, Bedminster, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 284 days.

(21) Appl. No.: 10/926,507

(22) Filed: Aug. 26, 2004

(65) Prior Publication Data

US 2006/0048035 A1     Mar. 2, 2006

(51) Int. Cl.
*H03M 13/00* (2006.01)
(52) U.S. Cl. ............... 714/755; 714/794; 714/786
(58) Field of Classification Search ........... 714/755, 714/794
See application file for complete search history.

(56) References Cited

U.S. PATENT DOCUMENTS

| | | | | |
|---|---|---|---|---|
| 6,510,536 | B1 * | 1/2003 | Crozier et al. | 714/755 |
| 6,904,555 | B2 * | 6/2005 | Nagase et al. | 714/751 |
| 2002/0184596 | A1 * | 12/2002 | Dinc et al. | 714/794 |
| 2003/0023919 | A1 * | 1/2003 | Yuan et al. | 714/755 |
| 2004/0064778 | A1 * | 4/2004 | Widdup | 714/758 |
| 2004/0153940 | A1 * | 8/2004 | Yu et al. | 714/746 |
| 2004/0260995 | A1 * | 12/2004 | Allpress | 714/755 |
| 2005/0086570 | A1 * | 4/2005 | Ariyoshi | 714/755 |

OTHER PUBLICATIONS

Shao et al. Two Simple Stopping Criteria for Turbo Decoding. IEEE Transactions on Communications, vol. 47, No. 8, Aug. 1999. pp. 1117-1120.*
Claude Berrou et al., Near Optimum Error Correcting Coding and Decoding: Turbo-Codes, *IEEE Transactions On Communications*, vol. 44, No. 10, Oct. 1996, pp. 1261-1271.
Joachim Hagenauer, et al., "Iterative Decoding Of Binary Block And Convolutional Codes", *IEEE Transactions On Information Theory*, vol. 42, No. 2, Mar. 1996, pp. 429-445.
L. R. Bahl et al., "Optimal Decoding Of Linear Codes For Minimizing Symbol Error Rate", *IEEE Transactions On Information Theory*, Mar. 1974, pp. 284-287.

* cited by examiner

*Primary Examiner*—Guy J Lamarre
*Assistant Examiner*—Sam Rizk

(57) ABSTRACT

The need for separate CRC bits is eliminated by taking advantage of what has been determined to be an embedded error detection capability in a turbo code itself to perform error detection following turbo decoding. Specifically, since the two constituent encoders of a turbo encoder that are used to encode a data packet produce two systematic codes that share the same systematic bits one code, one is used to serve as the parity check for the other. The sign of the log likelihood ratio (LLR) of each systematic bit in a block of decoded data calculated at the end of a turbo decoding cycle is compared with the sign of the LLR of each corresponding bit that was calculated at a previous turbo decoding cycle. If the signs of the LLRs for each comparison do not agree, then a packet error is determined to have occurred; otherwise no packet error is detected.

12 Claims, 5 Drawing Sheets

METHOD AND APPARATUS FOR DETECTING A PACKET ERROR IN A WIRELESS COMMUNICATIONS SYSTEM WITH MINIMUM OVERHEAD USING EMBEDDED ERROR DETECTION CAPABILITY OF TURBO CODE

TECHNICAL FIELD

This invention relates to wireless communications, and more particularly, to detecting a turbo-coded packet error at the receiver in a wireless communications system.

BACKGROUND OF THE INVENTION

In wireless communications systems, such as those operating in accordance with 3GPP2 CDMA2000-1x standards and 3GPP UMTS W-CDMA standards, a turbo code has been adopted for data transmission on both the uplink and downlink due to its superior error correcting capabilities. To detect the residue errors that cannot be corrected by the turbo decoder, Cyclic Redundancy Check (CRC) code bits are appended to the packet data before the encoder at the transmitter. A CRC check is then performed at the receiver on the decoded packet to determine whether a pass or fail results.

FIG. 1 shows a high-level block diagram of wireless communications system that uses turbo encoding for error correction and CRC for error detecting. This block diagram is applicable to both 3GPP2 and 3GPP systems at the conceptual level. At the transmitter 101, which can be either within a mobile terminal or a base station, a CRC circuit 102 determines the CRC bits to be appended to a data packet on input 103 that is to be transmitted to receiver 104. Turbo encoder 105 then encodes the resultant block of data. The turbo-encoded packet is then processed by the physical channel processing circuitry 106, which performs such functions, for example, as spreading, scrambling, modulating and multiplexing for transmission over propagation channel 107 in accordance with the whatever system standards are being employed. At receiver 104, the physical channel processing circuitry 108 performs the opposite functions of circuitry 106, including de-multiplexing, demodulation, descrambling and despreading, to produce at its output a set of soft symbol metrics representing the data at the output of turbo encoder 105 in the transmitter. Turbo decoder 109 then processes these soft symbol metrics to produce a block of bits at its output that includes the CRC bits appended to the data packet on input 103 at the transmitter 101 by CRC circuit 102. Using the same methodology employed by CRC circuit 102 in the transmitter 101, CRC checker 110 performs a CRC check by calculating the CRC from those bits within the decoded data block at the output of turbo decoder 109 that correspond to the transmitted data packet. If the CRC determined by CRC checker 110 matches the CRC in the block of bits at the output of turbo decoder 109, then the received packet has passed its CRC check and no packet error is detected. CRC checker 110 then outputs a CRC Pass and the decoded data packet on outputs 111 and 112, respectively. If the CRC determined by CRC checker 110 doesn't match the CRC in the decoded block of bits at the output of turbo decoder 109, then the CRC has failed and a packet error is detected. CRC checker 110 then outputs a CRC Fail on output 111, which fail is reported to the higher layer. Disadvantageously, CRC bits introduce overhead, and when the data block size is small, the overhead can be large. For example, in 3GPP2, the smallest data block length for the turbo code is 174 bits. The CRC for this block size comprises 12 bits thereby introducing an overhead of 10 $\log_{10}(1+12/174)=0.29$ dB. For 3GPP, the smallest data size for the turbo code is 40 bits. When a CRC of 24 bits is used, the overhead is 10 $\log_{10}(1+12/40)=2.04$ dB. It is desirable, therefore, to reduce the overhead introduced by CRC bits while still retaining the error detecting functionality that a CRC check affords.

SUMMARY OF THE INVENTION

The inventors have realized that advantage can be taken of an embedded error detection capability in the turbo code itself to perform error detection following turbo decoding, thereby eliminating the need for separate CRC bits. Specifically, the inventors have realized that since the two constituent encoders of a turbo encoder that are used to encode a data packet produce two systematic codes that share the same systematic bits, one code can serve as the parity check for the other. In particular, in accordance with an embodiment of the invention, a bit-by-bit comparison is made between the detected systematic bits within a block of bits at the end of a turbo decoding cycle with corresponding detected systematic bits at the end of any previous turbo decoding cycle. If all the bits do not match, then a determination is made that a packet error has occurred; otherwise no packet error is detected. In particular, the sign of the log likelihood ratio (LLR) of each systematic bit in a block of decoded data calculated at the end of a turbo decoding cycle is compared with the sign of the LLR of each corresponding bit that was calculated at any previous turbo decoding cycle. If the signs of the LLRs for each comparison do not agree, then a packet error is determined to have occurred; otherwise no packet error is detected.

In a first embodiment of the present invention, at the end of a plurality of turbo decoding iteration cycles, where a turbo decoding iteration cycle is defined as a turbo decoding cycle in which a first turbo constituent code is decoded followed by a turbo decoding cycle in which a second turbo constituent code is decoded, the signs of the LLRs determined for each systematic bit in one of the two constituent codes are compared with the signs of the LLRs determined for each corresponding systematic bit in the other of the two consistent codes. If the signs of the LLRs are not the same for each corresponding systematic bit, then a packet error is determined to have occurred; otherwise no packet error is detected. In a second embodiment, the signs of the LLRs determined for each systematic bit at the end of a plurality of turbo decoding iteration cycles are compared with the signs of the LLRs for corresponding systematic bits at the end of the immediate previous turbo decoding iteration cycle. As in the first embodiment, if the signs of the LLRs are not the same for each corresponding systematic bit, then a packet error is determined to have occurred; otherwise no packet error is detected.

DETAILED DESCRIPTION

As afore noted, turbo coding is widely used in third generation wireless system such as 3GPP and 3GPP2, as well as in broadband fixed wireless IEEE802.16 systems and in satellite communications. Turbo coding is a well known in the art type of coding using a concatenation of two component codes (see, e.g., C. Berrou and A. Glavieux, "Near Optimum Error Correcting Coding and Decoding: Turbo-Codes," *IEEE Trans. Commun.*, vol 44, pp. 1261-1271, October 1996, and J. Hagenauer, "Iterative Decoding of Binary Block and Convolutional Codes," *IEEE Trans. Information Theory*, vol. 42, pp. 429-445, March 1996). At the decoder, soft-decision decoding is performed on both received codes generating soft outputs (log-likelihood ratios). Specifically, decoding is split between the two codes by two decoders, one decoder exchanging the soft output with the other decoder after its own decoding, with the decoding being carried out multiple times, in a ping-pong manner, so that each iteration generates better quality more robust soft outputs. This iterative principle is similar to that of the turbo engine from whence the name "turbo codes" has been derived.

Figure 1:
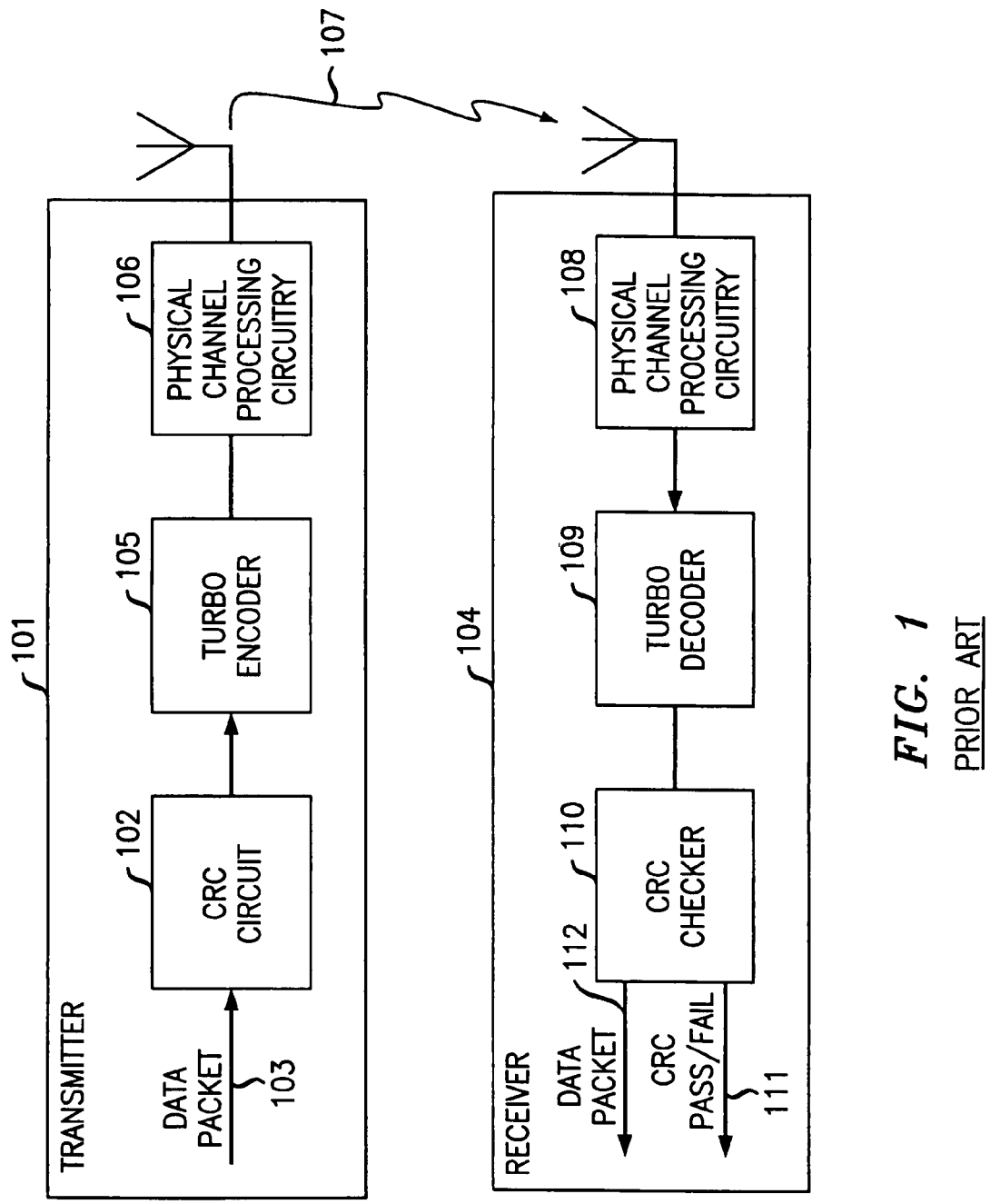
FIG. 1 shows a block diagram of a prior art wireless communications system employing separate CRC coding and turbo encoding.
Figure 2:
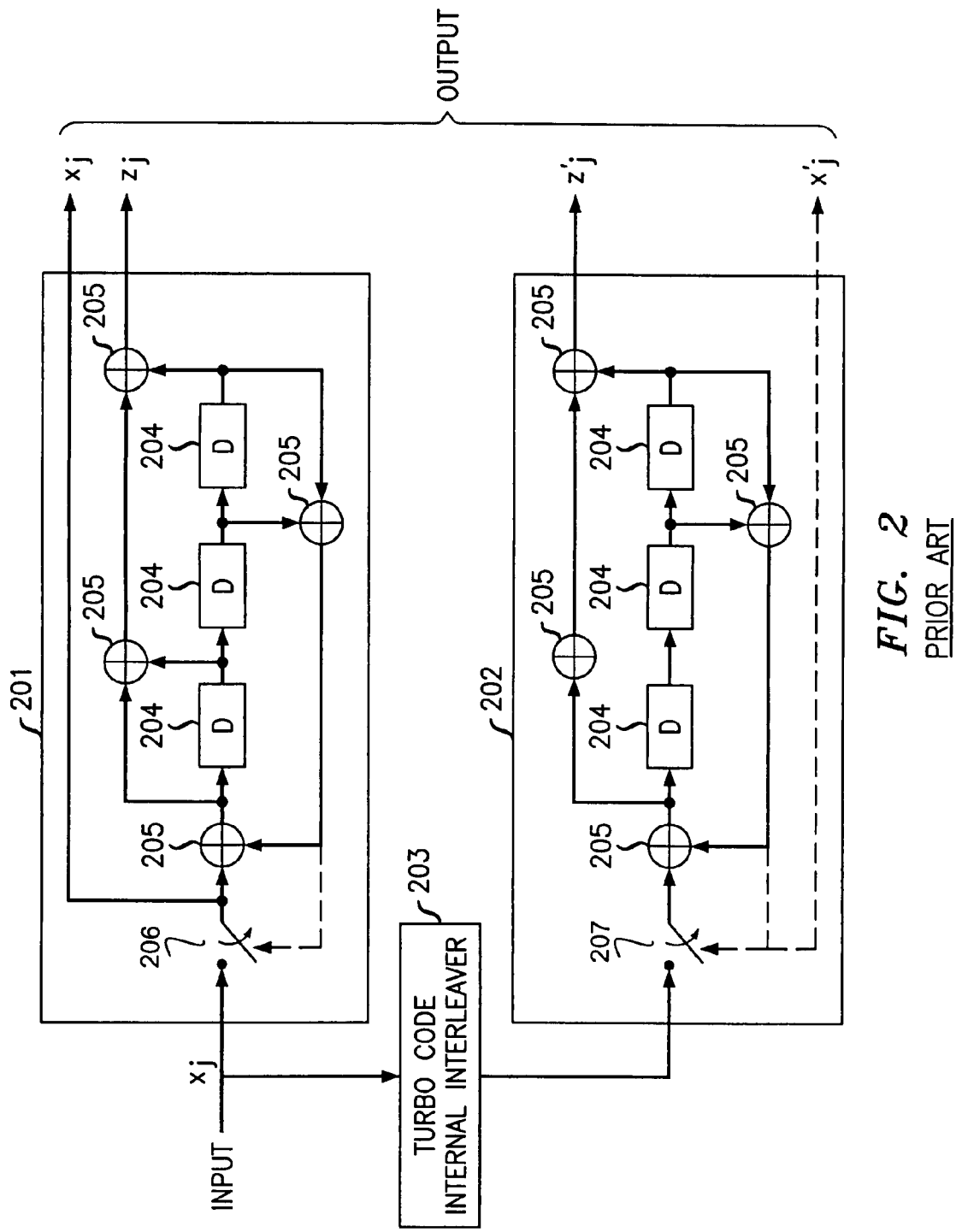
FIG. 2 is a block diagram of a prior art turbo encoder.

FIG. 2 shows a block diagram of an example of a rate ⅓ turbo encoder as is used in 3GPP wireless communications systems. The structure of this turbo encoder is a Parallel Concatenated Convolutional Coder (PCCC) with two identical eight-state ½ constituent systematic convolutional encoders 201 and 202 and one turbo code internal interleaver 203. Interleaving (and de-interleaving at the decoder) is performed to minimize the interactive effect that burst errors could impart to the log likelihood ratios determined for each component code at the decoder.

The transfer function of the eight-state constituent code for the PCCC is given by:

$$G(D) = \left[1, \frac{g_1(D)}{g_0(D)}\right], \quad (1)$$

where $$g_0(D)=1+D^2+D^3,$$

and $$g_1(D)=1+D+D^3.$$

When a data packet consisting of a set of K bits $\{x_j\}$ equal to $x_1, x_2, \ldots, x_K$, is inputted to the encoder, the entire packet is interleaved by internal interleaver 203 in a manner that is known to the decoder for de-interleaving purposes. The K bits within the interleaved packet, $\{x'_j\}$, are then sequentially inputted to the second constituent encoder 202 at the same time the K non-interleaved bits $\{x_j\}$ of the packet are sequentially inputted to the first constituent encoder 201. Constituent encoders 201 and 202, which are essentially identical, each includes three shift registers 204, which are all set at an initial value of zero before any of the packet bits are inputted. As each $x_j$ bit is inputted, encoder 201 codes that same bit into itself as a systematic bit, $x_j$, while also forming a parity bit, $z_j$. The parity bit is determined by the encoder structure comprising the shift registers 204 and modulo-2 adders 205 and is formed from a combination of previous input bits as shifted through, fed back, and combined with each other by the feedback shift register structure of encoder 201. As each interleaved $x'_j$ bit is inputted, encoder 202 similarly outputs a parity bit $z'_k$. Since the systemic bits from encoder 202 are only an interleaved version of the same systemic bits outputted by encoder 201, encoder 202 does not output $x'_j$. The output from the turbo encoder in response to the K bits of input packet $\{x_j\}$ thus consists of the outputs from constituent encoder 201 and constituent encoder 202 and is equal to:

$$x_1, z_1, z'_1, x_2, z_2, z'_2, \ldots, x_K, z_K, z'_K.$$

As noted, $x_1, x_2, \ldots, x_K$ are the systematic bits inputted to both the first constituent encoder 201 and to the turbo code internal interleaver 203, K is the number of bits in the packet, and $z_1, z_2, \ldots, z_K$ and $z'_1, z'_2, \ldots, z'_K$ are the parity bits outputted from the first constituent encoder 201 and the second constituent encoder 202, respectively.

After all K information bits from the input packet have been inputted to encoders 201 and 202, trellis termination is performed by taking the tail bits from the shift register feedback. Specifically, first the constituent encoder 202 is disabled while the first three tail bits are used to terminate constituent encoder 201 by "moving" switch 206 in encoder 201 to its lower position. When in this lower position, a zero is shifted into the first shift register 204 as each bit is clocked through (since its input is the modulo 2 sum of two equal bits), and then sequentially into the other shift registers. Thus, after the tail bits $x_{K+1}, x_{K+2}$, and $x_{K+3}$ are clocked out, encoder 201 is in a desired all-zero state. Associated with these tail bits are parity bits $z_{K+1}, z_{K+2}$ and $z_{K+3}$, which are also clocked out. In a similar manner, the last three tail bits are used to terminate encoder 202 while the encoder 201 is disabled. Thus, with switch 207 in encoder 202 "moved" to its lower position, zeros are similarly clocked through each shift register 204 and tail bits $x'_{K+1}, x'_{K+2}$, and $x'_{K+3}$, and parity bits $z'_{K+1}, z'_{K+2}$ and $z'_{K+3}$ are clocked out. Since during trellis termination these $x'_j$ tail bits are not simply an interleaved version of the $x_j$ tail bits outputted by encoder 201, the turbo encoder transmits both $x_j$ and $x'_j$ for j=K+1 through j=K+3 during trellis termination. The transmitted bits for trellis termination are thus:

$$x_{K+1}, x_{K+2}, x_{K+1}, z_{K+1}, z_{K+2}, z_{K+3}, x'_{K+1}, x'_{K+2}, x'_{K+3},$$
$$z'_{K+1}, z'_{K+2}, z'_{K+3}.$$

After each of these bits has been transmitted, all the shift registers 204 are in the desired zero state and ready to receive input of the bits in the next packet.

Figure 3:
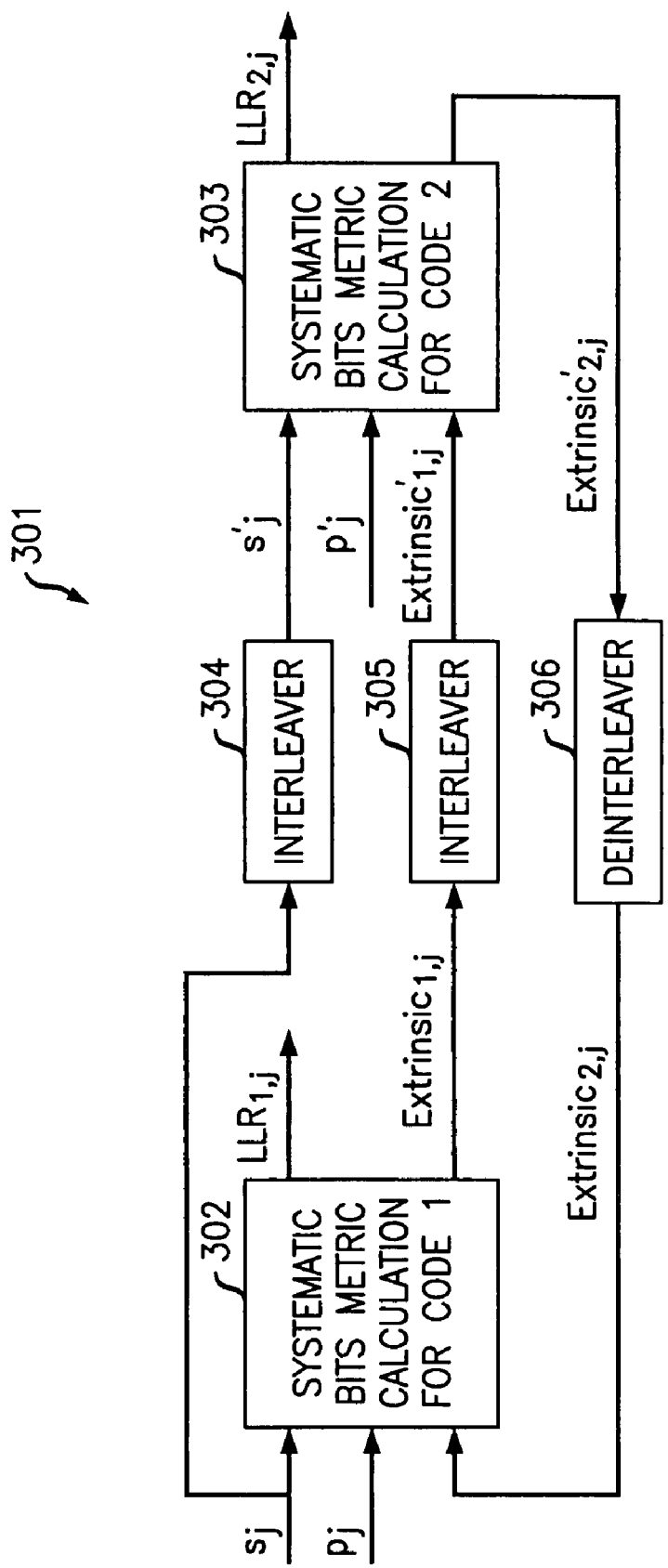
FIG. 3 is a block diagram of a prior art turbo decoder.

With reference to FIG. 3, a block diagram of a prior art turbo decoder 301 is shown. The inputs $s_j$, $p_j$ and $p'_j$ for j=1 to j=K are soft symbol metrics from the receiver demodulator and correspond to the transmit bits $x_j$ (the systematic bits), $z_j$ (first parity bit) and $z'_j$ (second parity bit) from FIG. 2, respectively. Before the decoder 301 starts to decode the received bits corresponding to an input packet, all the memory units in the interleavers and deinterleavers in the decoder are cleared to zero.

The decoding operation starts in block 302 with a systematic bits metric calculation for the first constituent code. This block essentially performs a BCJR algorithm (see, e.g., L. R. Bahl, J. Cocke, F. Jelinek, and J. Raviv, "Optimal Decoding of Linear Codes for Minimizing Symbol Error Rate," *IEEE Trans. Information Theory*, pp. 284-287, March 1974) to produce a log-likelihood ratio (LLR) for each systematic bit. The sign of the LLR represents the systematic bit value and its amplitude represents the likelihood. Thus, the higher the value of the LLR, the more likely that the bit value that is indicated by the LLR's sign is correct. If decoding were to be stopped after this sub-block 302 at the end of this first turbo decoding cycle, the decision for each bit in the packet delivered to the next higher layer for further processing or for a CRC check, would be determined by the sign of that bit's LLR, which would be mapped to a bit value by the following rule:

Non-positive LLR→1, Positive LLR→0.

The transmitted second constituent code, however, enables better performance, i.e., improved reliability, to be achieved. By feeding information derived from the first constituent decoder comprising systematic bit metric calculation block 302 to the systematic bits metric calculation block 303 for the second constituent code in a next turbo decoding cycle, advantage is taken of those systematic bit metrics (LLRs) generated from the first constituent decoder 302. Since the interleaving performed by interleaver 203 in the turbo encoder of FIG. 2 is known to the decoder 301, interleaver 304 interleaves the soft symbol metrics $s_j$ in accordance with the soft symbol metrics $p'_j$ that correspond to the parity bits $z'_j$ transmitted by the second constituent encoder 202. Input to the systematic bits metric calculation block 303 that constitutes the second decoder thus includes these interleaved soft symbol metrics $s'_j$ and the soft symbol metrics $p'_j$ corresponding to the second transmitted parity bit.

It can be noted that the received symbols metrics for the systematic bits ($s_j$ and $s'_j$) are shared by both systematic bits metric calculation blocks 302 and 303. The only information that is used by the first systematic bits metric calculation block 302 which cannot be directly used by the second systematic bits metric calculation block 303 is the parity bit soft symbols metrics, $p_j$, because, due to the turbo interleaving, the second systematic bits metric calculation block 303 doesn't recognize the parity bits from the first code. Therefore the information about the systematic bits that is derived from the parity bits in the first decoder is passed to the second systematic bits metric calculation block 303 of the second constituent decoder as a priori information about the systematic bits. That information is the $\text{Extrinsic}_{1,j}$ output of the first systematic bits metric calculation block 302, which is obtained from:

$$\text{Extrinsic}_{1,j}=\text{LLR}_{1,j}-s_j-\text{Extrinsic}_{2,j} \quad (2)$$

For the initial cycle of turbo decoding the first constituent code, the $\text{Extrinsic}_{2,j}$ term is zero for all j since the second decoder does not produce any outputs until after the first decoder has produced its first $\text{Extrinsic}_{1,j}$ output.

For the second turbo decoding cycle, the second systematic bits calculation block 303 calculates the LLRs for the interleaved systematic soft symbol metrics $s'_j$ at the output of interleaver 304 in the same manner as the first systematic bits calculation block 302 calculated the LLRs for the systematic soft symbol metrics $s_j$. The input soft symbol metrics are the interleaved versions of the soft symbol metrics $s_j$ in which the metrics corresponding to the tail systematic bits for the first constituent code are replaced with the soft symbol metrics corresponding to the tail bits of the second constituent code. The $\text{Extrinsic}_{1,j}$ outputs of the systematic bits metric calculation block 302 are interleaved by interleaver 305 to align with the order of the $s'_j$ values. The second systematic bits calculation block 303 produces the LLRs and the $\text{Extrinsic}'_{2,j}$, which represents information on the systematic bits carried by $p'_j$. This output is obtained from:

$$\text{Extrinsic}'_{2,j}=\text{LLR2}_{1,j}-s'_j-\text{Extrinsic}'_{1,j}. \quad (3)$$

If decoding were to stop at this point, the decision for each bit in the packet delivered to the next higher layer following the turbo decoder would be determined by the sign of that bit's LLR, which would be mapped to a bit value, as above, by the following rule:

Non-positive LLR→1, Positive LLR→0.

At this point, the turbo decoding concept comes into play by noticing that the LLR calculation in the systematic bits metric calculation for the first constituent code has not used the information carried by $p'_j$, corresponding to the parity bits for the second constituent code. This information is reflected in the $\text{Extrinsic}'_{2,j}$ output of equation (3) above. Therefore, once the $\text{Extrinsic}'_{2,j}$ outputs are available, they are de-interleaved by de-interleaver 306 to align with the order of the $s_j$ and $p_j$ values and fed back to the first systematic bits metric calculation block 302. The turbo decoding cycle performed therein is then repeated with the updated $\text{Extrinsic}'_{2,j}$ information to update both the $\text{LLR}_{1,j}$ and $\text{Extrinsic}'_{1,j}$ information calculated by that block. The updated information produced at this turbo decoding cycle can now be used to repeat the second systematic bits metric calculation. This process of iterative turbo decoding cycles can be made as many times as desired, with progressive performance improvement diminishing after ten turbo decoding iteration cycles, where one turbo decoding iteration cycle is defined as a turbo decoding cycle performed by the first constituent decoder followed by a turbo decoding cycle performed by the second constituent decoder. The final decision on the systematic bits can be made based on the signs of $\text{LLR}_{1,j}$ or $\text{LLR}_{2,j}$ depending on whether the process stops at the output of the first constituent decoder or the second constituent decoder, respectively.

The inventors herein have realized that since the two constituent codes share the same systematic bits, that one code can serve as the parity check for the other. In a first embodiment, at the end of the nth turbo decoding iteration cycle, for each systematic bit, the bit value indicated by the sign of the LLR produced by one constituent decoder is compared with the bit value indicated by the sign of the LLR produced by the other constituent decoder for a corresponding systematic bit. If the signs and thus decoded bits agree for each comparison, then the decision is made that no packet error has occurred. Otherwise, a decision is made that a packet error has occurred.

Figure 4:
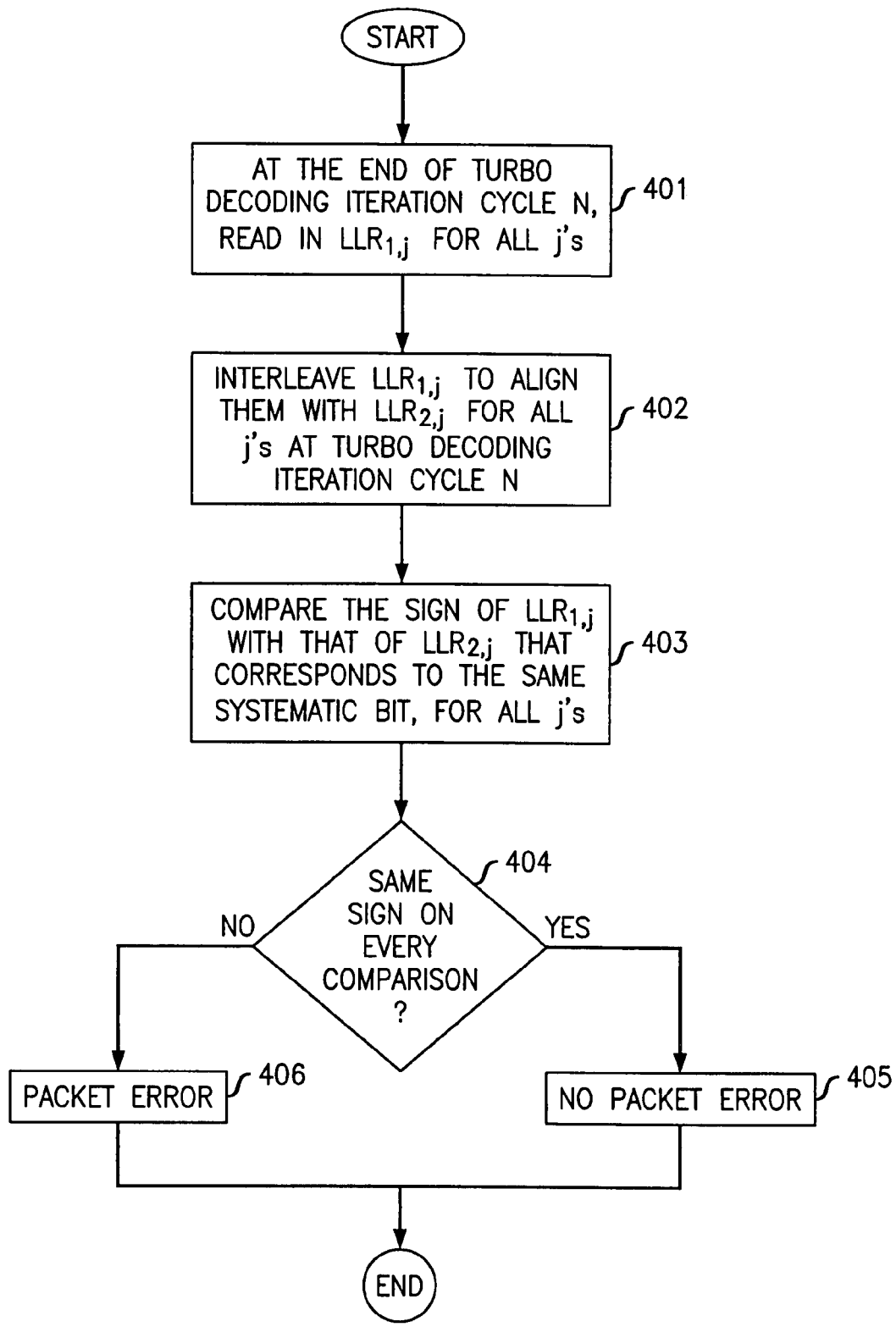
FIG. 4 is a flowchart detailing a first embodiment of the present invention for determining whether a packet error has occurred.

FIG. 4 illustrates the steps of this first embodiment. At step 401, at the end of the nth turbo decoding iteration cycle, $\text{LLR}_{1,j}$ is read in for each j=1 to j=K. At step 402, these LLRs are interleaved so that they each are aligned with a corresponding systematic bit associated with $\text{LLR}_{2,j}$. At step 403, for each j, the sign of each $\text{LLR}_{1,j}$ is compared with the sign of $\text{LLR}_{2,j}$ that correspond to the same systematic bit. At step 404, a determination is made whether the sign of each comparison is the same. If yes, at step 405, a determination is made that no packet error has occurred. If no, at step 406, a determination is made that a packet error has occurred. That decision can then be reported to the higher layer for further processing.

Figure 5:
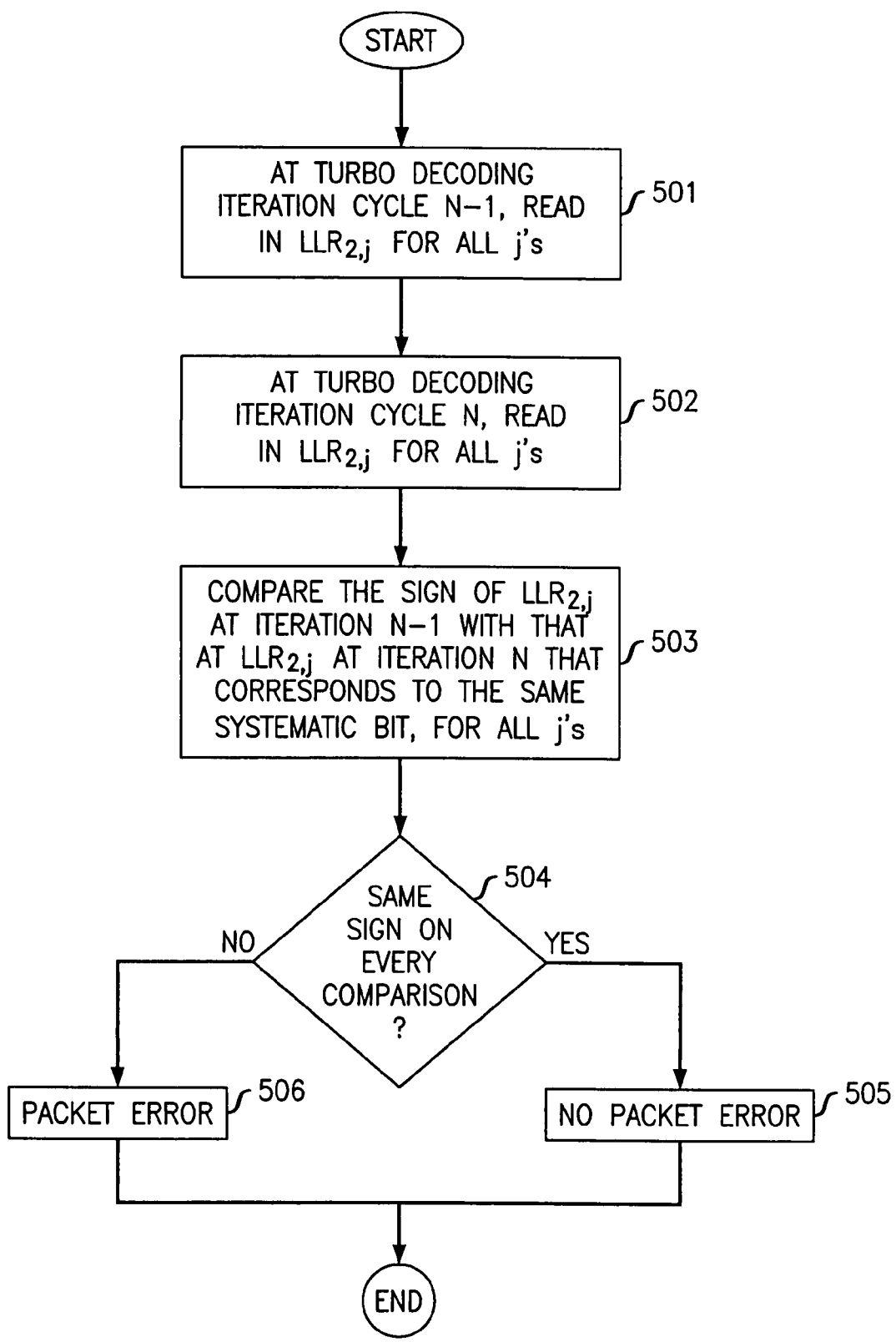
FIG. 5 is a flowchart detailing a second embodiment of the present invention for determining whether a packet error has occurred.

FIG. 5 shows a second embodiment of the present invention in which the bits that would be decoded from the signs of the LLRs generated by the second constituent decoder at the end of a turbo decoding iterative cycle are compared with the bits that would be decoded from the signs of the LLRs generated by the same second decoder at the end of the previous tulrbo decoding iterative cycle. If the signs associated with each LLR is not the same, then the decoding is likely not converging with high probability and the decoded sequence is in error. In this embodiment, at step 501, at the (n−1)th turbo iteration cycle, $\text{LLR}_{2,j}$ is read in for all j=1 to j=K. At step 502, at the nth turbo decoding iteration cycle, $\text{LLR}_{2,j}$ is read in for all j=1 to j=K. Since the LLRs for the same j correspond to the same systematic bit, no de-interleaving is necessary. At step 503, the sign of $\text{LLR}_{2,j}$ at the (n−1)th iteration is compared with the sign of $\text{LLR}_{2,j}$ at the nth iteration cycle for each j. At step 504, a determination is made whether the signs are the same for each comparison. If yes, then, at step 505, a determination is made that there has been no packet error. If no, then, at step 506, a determination is made there has been a packet error.

Similar results could be achieved by comparing the signs of the LLRs produced by either the first or second decoder at the end of a turbo decoding cycle with the signs of the LLRs that correspond to the same systematic bits and which are produced by the first or second decoder at the end of any preceding turbo decoding cycle, whether within the same turbo decoding iterative cycle or different turbo decoding iterative cycles.

While the particular invention has been described with reference to the illustrative embodiments, this description should not be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Although being noted as applicable to 3GPP2 CDMA2000-1x and 3GPP UMTS W-CDMA standards, the present invention could be implemented in any CDMA or non-CDMA, wireless or wired electrical or optical communication system that uses turbo encoding and decoding. Further, the invention may be implemented in different locations, such as a base station (NodeB in UMTS terminology) or a mobile terminal (UE in UMTS terminology), or anywhere else where turbo decoding might be performed. The processing circuitry required to implement and use the described invention may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention. It is therefore contemplated that the appended claims will cover any such modifications or embodiments as fall within the true scope of the invention.

The invention claimed is:

1. A method for detecting an error in a block of decoded bits at a turbo decoder, the method comprising:
    comparing, on a bit-by-bit basis, a first set of decoded systematic bit values for a first constituent code with a corresponding second set of decoded systematic bit values for a second constituent code,
        each of the first and second sets of decoded systematic bit values being generated during a first iteration of a turbo decoding iteration cycle, and
        each decoded systematic bit value in the first and second sets of decoded systematic bit values being represented by a sign of a log likelihood ratio, wherein the comparing step includes,
        comparing signs of the log likelihood ratios for corresponding bits of the first and second sets of decoded systematic bit values; and
    determining, from the results of the bit-by-bit comparisons of the signs of the log likelihood ratios, whether or not there is an error in the decoded systematic bit values in the block of decoded bits determined at the end of the first turbo decoding cycle.

2. The method of claim 1, wherein the step of determining determines that there is an error if one or more comparisons of corresponding bit values does not match.

3. The method of claim 1, wherein the step of determining determines that there is no error if the comparisons of corresponding bit values all match.

4. The method of claim 1, wherein the first iteration of the turbo decoding iteration cycle includes a first turbo decoding cycle in which a first turbo constituent code is decoded to generate the first set of decoded systematic bit values and a second turbo decoding cycle in which a second turbo constituent code is decoded to generate the second set of decoded systematic bit values.

5. The method of claim 1, wherein the step of determining determines that there is an error if one or more comparisons of the signs of log likelihood ratios associated with corresponding bits does not match.

6. The method of claim 1, wherein the step of determining determines that there is no error if the comparisons of log likelihood ratios associated with corresponding bits values all match.

7. An apparatus for detecting an error in a block of bits decoded by a turbo decoder that includes a first constituent turbo decoder and a second constituent turbo decoder, the apparatus comprising:
    means for comparing, on a bit-by-bit basis, a first set of decoded systematic bit values for a first constituent code with a corresponding second set of decoded systematic bit values for a second constituent code,
        each of the first and second sets of decoded systematic bit values being generated during a first iteration of a turbo decoding iteration cycle, and
        each decoded systematic bit value in the first and second sets of decoded systematic bit values being represented by a sign of a log likelihood ratio, wherein
        the comparing means compares, signs of the log likelihood ratios for corresponding bits of the first and second sets of decoded systematic bit values; and
    means for determining, from the results of the bit-by-bit comparisons of the signs of the log likelihood ratios, whether or not there is an error in the decoded systematic bit values in the block of decoded bits determined at the end of the first turbo decoding cycle.

8. The apparatus of claim 7, wherein the determining means determines that there is an error if one or more comparisons made by the comparing means of corresponding bit values does not match.

9. The apparatus of claim 7, wherein the determining means determines that there is no error if the comparisons made by the comparing means of corresponding bit values all match.

10. The apparatus of claim 7, wherein the determining means determines that there is an error if one or more comparisons made by the comparing means of corresponding bit values does not match.

11. The apparatus of claim 7, wherein the determining means determines that there is no error if the comparisons made by the comparing means of corresponding bit values all match.

12. The apparatus of claim 7, wherein the first iteration of the turbo decoding iteration cycle includes a first turbo decoding cycle in which a first turbo constituent code is decoded to generate the first set of decoded systematic bit values and a second turbo decoding cycle in which a second turbo constituent code is decoded to generate the second set of decoded systematic bit values.

* * * * *